United States Patent
Anderson et al.

(10) Patent No.: US 11,195,795 B1
(45) Date of Patent: Dec. 7, 2021

(54) WELL-CONTROLLED EDGE-TO-EDGE SPACING BETWEEN ADJACENT INTERCONNECTS

(71) Applicant: International Business Machines Corporation, Armonk, NY (US)

(72) Inventors: Brent Anderson, Jericho, VT (US); Lawrence A. Clevenger, Saratoga Springs, NY (US); Nicholas Anthony Lanzillo, Wynantskill, NY (US); Christopher J. Penny, Saratoga Springs, NY (US); Kisik Choi, Watervliet, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/891,143

(22) Filed: Jun. 3, 2020

(51) Int. Cl.
*H01L 23/528* (2006.01)
*H01L 21/768* (2006.01)
*H01L 23/522* (2006.01)

(52) U.S. Cl.
CPC .... *H01L 23/5283* (2013.01); *H01L 21/76804* (2013.01); *H01L 23/5226* (2013.01)

(58) Field of Classification Search
CPC ............. H01L 23/5283; H01L 23/5226; H01L 21/76804
USPC ........................................................ 257/774
See application file for complete search history.

(56) References Cited

U.S. PATENT DOCUMENTS

| 9,054,160 | B2* | 6/2015 | Bruce | H01L 21/76835 |
| 9,263,325 | B1 | 2/2016 | Wei et al. | |
| 9,508,642 | B2 | 11/2016 | Bouche et al. | |
| 9,711,372 | B2 | 7/2017 | Lee et al. | |
| 9,818,640 | B1 | 11/2017 | Stephens et al. | |
| 9,818,641 | B1 | 11/2017 | Bouche et al. | |
| 10,049,920 | B1 | 8/2018 | Anderson et al. | |
| 10,115,633 | B2 | 10/2018 | Zhang et al. | |
| 10,242,907 | B2 | 3/2019 | Ryckaert et al. | |
| 10,347,506 | B2 | 7/2019 | Fan et al. | |
| 2012/0261828 | A1* | 10/2012 | Bruce | H01L 21/76801 257/774 |
| 2019/0157082 | A1 | 5/2019 | Fan et al. | |

\* cited by examiner

Primary Examiner — Tu-Tu V Ho
(74) Attorney, Agent, or Firm — Cantor Colburn LLP; Randall Bluestone

(57) ABSTRACT

Embodiments of the invention include a method of forming a multi-layer integrated circuit (IC) structure that includes forming a first dielectric layer. A first interconnect is formed in the first dielectric layer and includes a first top surface, a first bottom surface, and a first sidewall extending from an edge of the first top surface to an edge of the first bottom surface. A second interconnect is formed in the first dielectric layer and includes a second top surface, a second bottom surface, and a second sidewall extending from an edge of the second top surface to an edge of the second bottom surface. A spacing from the edge of the first top surface to the edge of the second top surface is greater than a spacing from the edge of the first bottom surface to the edge of the second bottom surface.

20 Claims, 5 Drawing Sheets

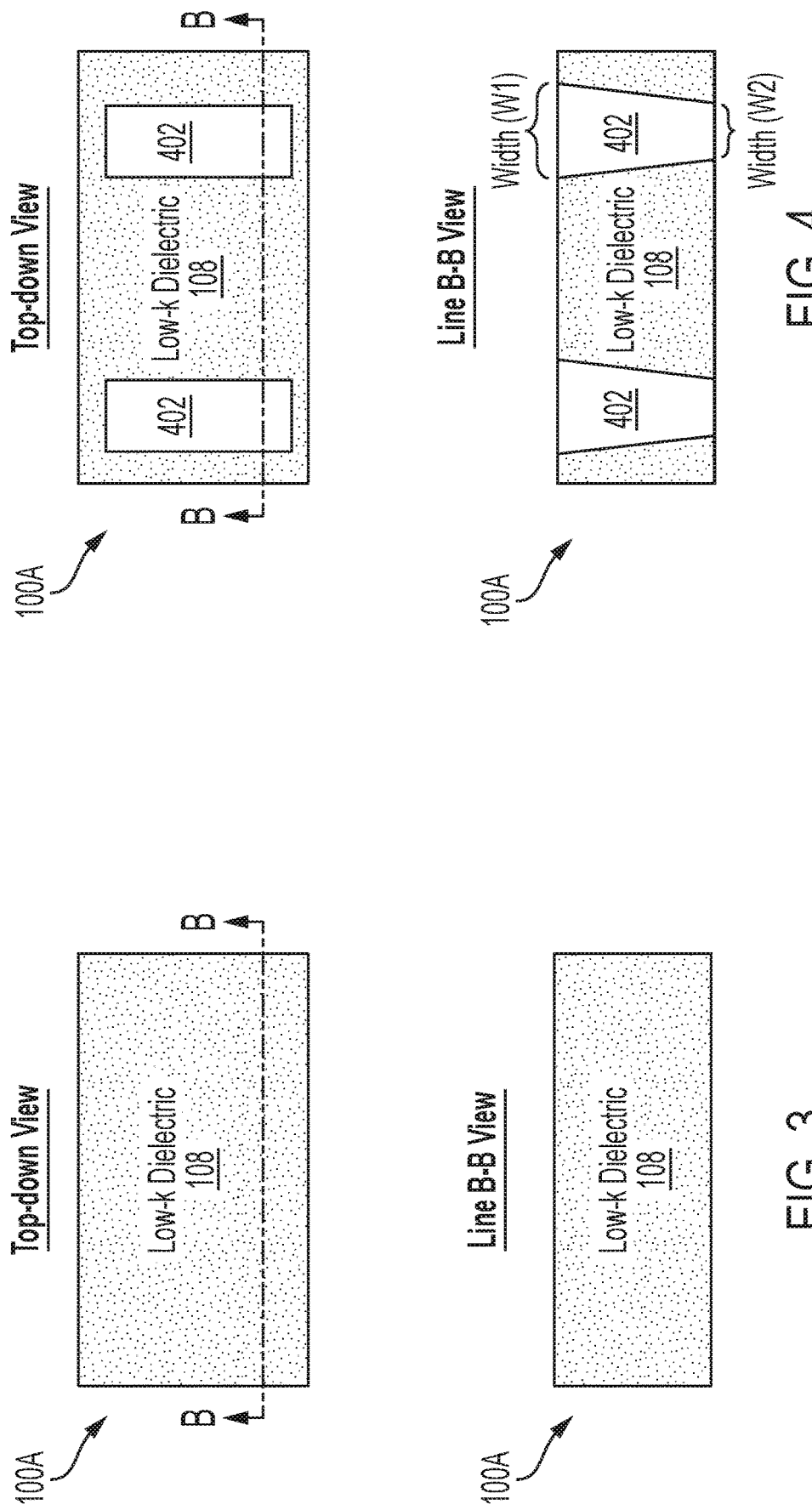

WELL-CONTROLLED EDGE-TO-EDGE SPACING BETWEEN ADJACENT INTERCONNECTS

BACKGROUND

The present invention generally relates to fabrication methods and resulting structures for integrated circuit (IC) wafers. More specifically, the present invention relates to fabrication methods and resulting interconnect structures having well-controlled edge-to-edge spacing between adjacent interconnect structures.

ICs are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming interconnect structures (e.g., lines, wires, metal-filled vias, contacts, and the like) that communicatively couple to active regions (e.g., gate, source, and drain) of the device element. Layers of interconnect structures are formed above these logical and functional layers during the BEOL stage to complete the IC. Most ICs need more than one layer of interconnects to form all the necessary connections, and as many as 5-12 layers are added in the BEOL process. Included among the various interconnect structures in the BEOL layers metal-filled vias configured to couple one interconnect structure to another and/or couple one wafer layer to another.

The terms "place and route" are often used to refer to IC design stages that map out the placement of electronic components/circuitry, and also maps out the routing of the interconnect structures needed to connect the placed components/circuitry. In known IC interconnect fabrication techniques, a so-called "edge-to-edge" spacing between the adjacent interconnect structures (e.g., lines) can be defined by a "cut region," which is a dielectric region between the edges of two adjacent interconnect structures.

SUMMARY

Embodiments of the invention include a method of forming a multi-layer integrated circuit (IC) structure that includes forming a substrate having a major surface. A dielectric layer is formed that includes a dielectric material, wherein the dielectric layer is positioned above the major surface of the substrate. Formed in the dielectric layer is a first interconnect element having a first interconnect element top surface, a first interconnect element bottom surface, and a first interconnect element sidewall extending from an edge of the first interconnect element top surface to an edge of the first interconnect element bottom surface. A width dimension of the first interconnect element top surface is less than a width dimension of the first interconnect element bottom surface. Formed in a second interconnect element having a second interconnect element top surface, a second interconnect element bottom surface, and a second interconnect element sidewall extending from an edge of the second interconnect element top surface to an edge of the second interconnect element bottom surface. A width dimension of the second interconnect element top surface is less than a width dimension of the second interconnect element bottom surface. A spacing from the edge of the first interconnect element top surface to the edge of the second interconnect element top surface is greater than a spacing from the edge of the first interconnect element bottom surface to the edge of the second interconnect element bottom surface.

Embodiments of the invention include a method of forming a multi-layer IC structure that includes forming a substrate having a major surface. A first dielectric layer is formed that includes a first dielectric material, wherein the first dielectric layer is positioned above the major surface of the substrate. Formed in the first dielectric layer is a cut region having a cut region top surface; a cut region bottom surface; a cut region first sidewall extending from a first edge of the cut region top surface to a first edge of the cut region bottom surface; and a cut region second sidewall extending from a second edge of the cut region top surface to a second edge of the cut region bottom surface. A width dimension of the cut region top surface is greater than a width dimension of the cut region bottom surface. The cut region includes a cut region material, and an etch rate characteristic of the first dielectric material in response to an etchant is greater than an etch rate characteristic of the cut region material in response to the etchant.

Embodiments of the invention include a multi-layer IC structure that includes a substrate having a major surface. A first dielectric layer includes a first dielectric material, wherein the first dielectric layer is positioned above the major surface of the substrate. A cut region is formed in the first dielectric layer, wherein the cut region includes a cut region top surface; a cut region bottom surface; a cut region first sidewall extending from a first edge of the cut region top surface to a first edge of the cut region bottom surface; and a cut region second sidewall extending from a second edge of the cut region top surface to a second edge of the cut region bottom surface. A width dimension of the cut region top surface is greater than a width dimension of the cut region bottom surface. The cut region includes a cut region material, wherein an etch rate characteristic of the first dielectric material in response to an etchant is greater than an etch rate characteristic of the cut region material in response to the etchant.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 3-9 depict the results of fabrication operations for forming edge-to-edge spacing between adjacent interconnects of an IC wafer in accordance with embodiments of the invention, in which:

FIG. 3 depicts a top-down view and a line B-B cross-sectional view of the IC wafer after fabrication operations according to embodiments of the invention;

FIG. 4 depicts a top-down view and a line B-B cross-sectional view of the IC wafer after fabrication operations according to embodiments of the invention;

FIG. 5 depicts a top-down view and a line B-B cross-sectional view of the IC wafer after fabrication operations according to embodiments of the invention;

FIG. 6 depicts a top-down view and a line B-B cross-sectional view of the IC wafer after fabrication operations according to embodiments of the invention;

FIG. 7 depicts a top-down view and a line B-B cross-sectional view of the IC wafer after fabrication operations according to embodiments of the invention;

FIG. 8 depicts a top-down view and a line B-B cross-sectional view of the IC wafer after fabrication operations according to embodiments of the invention; and FIG. 9 depicts a top-down view and a line B-B cross-sectional view of the IC wafer after fabrication operations according to embodiments of the invention.

Figure 1:
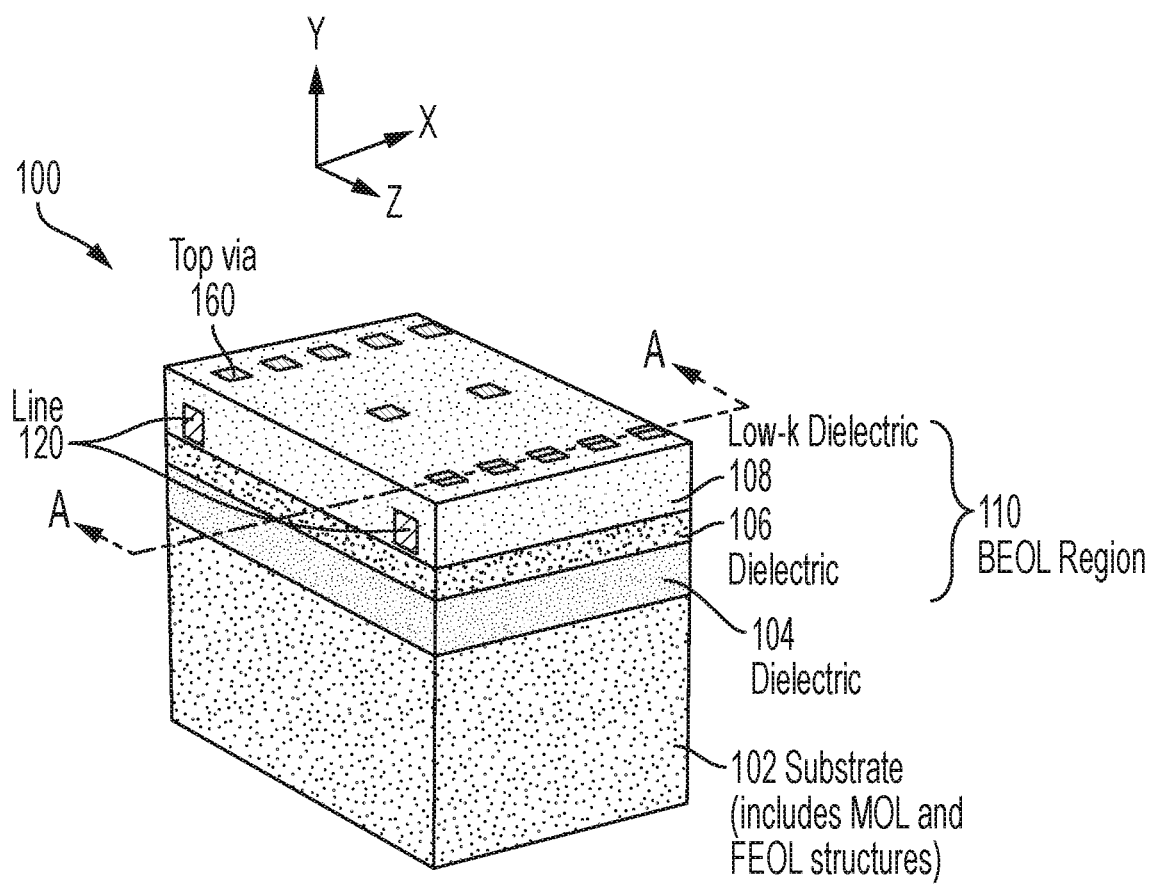
FIG. 1 depicts a three-dimensional view of a portion of an IC wafer that incorporates aspects of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two- or three-digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, semiconductor devices are used in a variety of electronic applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. In the BEOL stage, these device elements are connected to each other through a network of interconnect structures to distribute signals, as well as power and ground. The conductive interconnect layers formed during the BEOL stage serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metallization layers, complex ICs can have ten or more layers of wiring.

BEOL-stage interconnect structures that are physically close to FEOL-stage components (e.g., transistors and the like) need to be small because they attach/join to the components that are themselves very small and often closely packed together. These lower-level lines, which can be referred to as local interconnects, are usually thin and short in length. Global interconnects are higher up in the IC layer structure and travel between different blocks of the circuit. Thus, global interconnects are typically thick, long, and more widely separated than local interconnects. Vertical connections between interconnect levels (or layers) are known as metal-filled vias and allow signals and power to be transmitted from one layer to the next. For example, a through-silicon via (TSV) is a conductive contact that passes completely through a given semiconductor wafer or die. In multi-layer IC configurations, for example, a TSV can be used to form vertical interconnections between a semiconductor device located on one layer/level of the IC and an interconnect layer located on another layer/level of the IC. These vertical interconnect structures include an appropriate metal and provide the electrical connection of the various stacked metallization layers.

Insulating dielectric materials are used throughout the layers of an IC to perform a variety of functions including stabilizing the IC structure and providing electrical isolation of the IC elements. Additionally, in order to provide a parasitic resistance and capacitance (RC) level that is sufficiently low to support high signal speed applications, regions of the BEOL dielectric material can be formed from low-k and/or ultra-low-k (ULK) dielectric materials having a dielectric constant of less than silicon dioxide, and the interconnect structures (e.g., wire lines and vias) can be formed from copper-containing material. In general, a low-k dielectric generally has a k value that is less than about 4, and a ULK dielectric generally has a k value that is less than about 2.5.

However, there are difficulties with integrating low-k/ULK dielectric materials with metal interconnects in the dielectric layers of an IC. As previously noted herein, a so-called "edge-to-edge" spacing between the adjacent interconnect structures (e.g., conductive lines) can be defined by a dielectric region between the edges (or tips, or corners) of two adjacent interconnect structures. The dielectric region that defines the edge-to-edge spacing between adjacent interconnects is known generally as a "cut" region. Reducing interconnect edge-to-edge spacing is desirable in order to place interconnects closer together and maximize interconnect density. However, known edge-to-edge interconnect spacing techniques are difficult to control when etching low-k/ULK dielectric materials. For example, known methods of reducing edge-to-edge spacing require double patterning, which often involves complex and expensive patterning stacks.

Turning now to an overview of the aspects of the invention, embodiments of the invention address the shortcomings of known interconnect fabrication techniques by providing fabrication methods and resulting interconnect structures having well-controlled edge-to-edge spacing between adjacent interconnects. In embodiments of the invention, the edge-to-edge spacing between adjacent interconnects is defined by a cut region formed in a dielectric layer. The cut region is configured to include a cut region top surface; a cut region bottom surface; a cut region first sidewall extending from a first edge of the cut region top surface to a first edge of the cut region bottom surface; and a cut region second sidewall extending from a second edge of the cut region top surface to a second edge of the cut region bottom surface. A width dimension of the cut region top surface is greater than a width dimension of the cut region bottom surface.

In embodiments of the invention, the adjacent interconnects are formed in the dielectric layer, and because the cut region was formed prior to forming the adjacent interconnects, sidewalls of the cut region act as a template for sidewalls of the adjacent interconnects. Accordingly, each of the adjacent interconnects includes a top surface, a bottom surface and a sidewall extending from the top surface to the bottom surface. For each adjacent interconnect, a width dimension of the top surface is less than a width dimension of the bottom surface. Accordingly, a sidewall of each interconnect tapers outwardly from the interconnect as one moves along the sidewall from the interconnect top surface to the interconnect bottom surface.

In accordance with aspects of the invention, the width dimension of the cut region top surface represents a "designed" edge-to-edge spacing between the adjacent interconnects that is set by an interconnect routing plan, and the width dimension of the cut region bottom surface represents a "post-etch" edge-to-edge spacing between the adjacent interconnects that is determined by properties of an etchant used to form a cut region trench in which the cut region has been formed. In some embodiments of the invention, the etchant used to form the cut region trench has etch characteristics configured to etch the material in which the cut region trench is formed more rapidly in the vertical direction than the horizontal direction, thereby creating a cut region trench with sidewalls that taper inward (moving from top to bottom of the cut region trench) to form the general shape of an upside down pyramid. Accordingly, although the routing plan sets the designed edge-to-edge spacing between the adjacent interconnects, using aspects of the invention, portions of the interconnects that are below the interconnect top surfaces are in fact closer together than the designed edge-to-edge spacing, which has the beneficial result of increasing interconnect density in the dielectric layer over interconnect routing plans that are not implemented using aspects of the invention.

Figure 2:
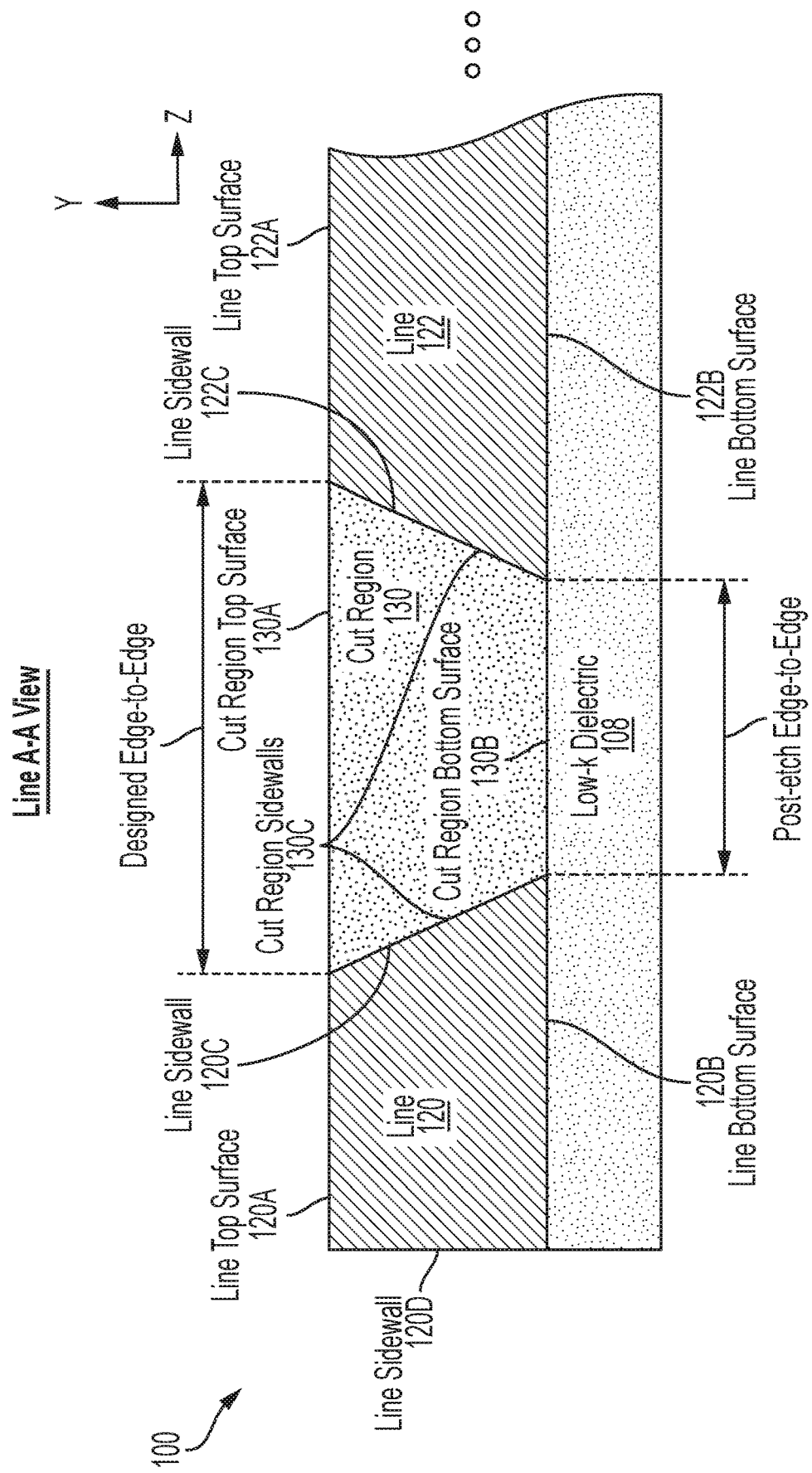
FIG. 2 depicts a cross-sectional view, taken along line A-A, of the IC wafer shown in FIG. 1.

Turning now to a more detailed description of aspects of the present invention, FIG. 1 depicts a portion of an IC wafer 100 in accordance with aspects of the invention, and FIG. 2 depicts a cross-sectional view of a sub-section of the IC wafer 100 taken along line A-A shown in FIG. 1. The following descriptions of the IC wafer 100 make reference to depictions of the wafer 100 shown in FIGS. 1 and 2. As best shown in FIG. 1, the IC wafer 100 includes a substrate 102 having middle-of-line (MOL) and front-end-of-line (FEOL) structures (not shown separately) formed in MOL and FEOL regions (not shown separately) of the substrate 102. A multi-layered BEOL region 110 is formed over a major surface of the substrate 102. The BEOL region 110 includes a first BEOL dielectric layer 104, a second BEOL dielectric layer 106, and a third BEOL dielectric layer 108, configured and arranged as shown. Although three dielectric layers 104, 106, 108 are shown in FIG. 1, the multi-layered BEOL region 110 can be provided with any number of dielectric layers. The third BEOL dielectric layer 108 is formed from a low-k (or ULK) dielectric material having a network of interconnect structures (e.g., lines 120 and/or top metal-filled vias 160) formed therein in accordance with aspects of the invention. In accordance with aspects of the invention, the line 120 can be adjacent to but separated from a line 122 (shown in FIG. 2) by a cut region 130 (shown in FIG. 2) configured and arranged, in accordance with aspects of the invention, to provide a well-controlled edge-to-edge spacing between the adjacent interconnects 120, 122. In accordance with aspects of the invention, some or all of the layers 104, 106, 108 in the BEOL region 110 can be provided with interconnect structures that include the lines 120, 122 and/or the cut region 130. In accordance with aspects of the invention, and as described in greater detail subsequently herein, the cut region 130 can be formed separately from the low-k dielectric 108 and in a well-controlled manner that enables the adjacent interconnects 120, 122 to be placed relatively close to one another, which increases interconnect density.

The lines (or wires) 120, 122 (shown in FIG. 2) and metal-filled vias 160 form a network of interconnect structures that can be configured to communicatively couple semiconductor devices (i.e., MOL/FEOL structures) of the substrate 102 to one another. In general, the lines 120, 122 conduct current horizontally in a predetermined pattern extending along the Z-axis and/or the X-axis, and the metal-filled vias 160 conduct current vertically along the Y-axis. In accordance with aspects of the invention, the lines 120, 122 and the metal-filled vias 160 can be formed in a "top-via" configuration, wherein the metal-filled via regions 160 are formed over and communicatively coupled to the lines 120, 122. In some embodiments of the invention, the metal-filled vias 160 can be below their respective lines 120, 122.

Insulating dielectric materials are used throughout the layers of the IC wafer 100 (best shown in FIG. 1) to perform a variety of functions including stabilizing the IC wafer 100 and providing electrical isolation of the IC devices (in the substrate 102) from the interconnect network (lines 120 and metal-filled vias 160). For example, the lines 120 and metal-filled vias 160 in the BEOL region 110 of the IC wafer 100 are isolated by dielectric layers 104, 106, 108 to prevent the lines 120 and metal-filled vias 160 from creating a short circuit with other metal layers/structures in the IC wafer 100. Additionally, in order to provide a parasitic resistance and capacitance (RC) level that is sufficiently low to support high signal speed applications, layers of the BEOL region 110 can be formed from low-k and/or ULK dielectric materials having a dielectric constant of less than silicon dioxide, and the lines 120 and metal-filled vias 160 can be formed from copper-containing material. The RC product is a measure of the time delay introduced into the IC's circuitry by the BEOL interconnect structures (i.e., lines 120 and metal-filled vias 160). As previously noted herein, a low-k dielectric generally has a k value that is less than about 4, and a ULK dielectric generally has a k value that is less than about 2.5. Suitable dielectric low-k/ULK materials for reducing interconnect capacitance include, for example, fluorine-doped silicon dioxide, porous organosilicate glass material (e.g., SiCOH), porous silicon dioxide, and organic polymeric materials such as polyimide, polynorbornenes, benzocyclobutene, and hydrogen silsesquioxane, and the like.

FIG. 2 depicts a cross-sectional view of the IC wafer 100 taken along line A-A of FIG. 1. In accordance with aspects of the invention, "place and route" IC design techniques have been used to map out the placement of electronic components/circuitry (e.g., MOL and FEOL structures in the substrate 102 shown in FIG. 1) and the routing of interconnect structures (e.g., adjacent lines 120, 122) needed to connect the placed components/circuitry. For ease of illustration and description, the adjacent lines 120, 122 are depicted without a corresponding meal-filled via 160 (shown in FIG. 1) communicatively coupled thereto. However, based on the specific requirements of the routing design, each of the adjacent lines 120, 122 may or may not be communicatively coupled to a metal-filled via 160. Embodiments of the invention contemplate implementations in which one or both of the adjacent lines 120, 122 are communicatively coupled to one or more of the metal-filled vias 160. Embodiments of the invention further contemplate implementations in which neither of the adjacent lines 120, 122 is communicatively coupled to one or more of the metal-filled vias 160.

In accordance with aspects of the invention, "edge-to-edge" spacing between the adjacent lines 120, 122 can be defined by the cut region 130 positioned between the adjacent lines 120, 122. In accordance with aspects of the invention, the cut region 130 is configured and arranged to include a cut region top surface 130A, a cut region bottom surface 130B, and cut region sidewalls 130C. In accordance with embodiments of the invention, a width dimension of the cut region top surface 130A is greater than a width dimension of the cut region bottom surface 130B, and the cut region sidewalls 130C are substantially non-parallel with respect one another, thereby creating cut region sidewalls 130C that taper inward toward one another as one moves along each cut region sidewall 130C from the cut region top surface 130A to the cut region bottom surface 130B. In accordance with aspects of the invention, the cut region 130 is formed from a material having etch selectivity with respect to the low-k dielectric layer 108 such that an etchant that etches the low-k dielectric layer 108 will not substantially etch the cut region 130. In accordance with aspects of the invention, the cut region 130 can be formed from a dielectric material (e.g., a nitride) having etch selectivity with respect to the low-k dielectric layer 108 (e.g., an oxide) such that an etchant that etches the low-k dielectric layer 108 will not substantially etch the cut region 130. In accordance with aspects of the invention, the cut region 130 can be formed from a high-k dielectric material having etch selectivity with respect to the low-k dielectric layer 108 such that an etchant that etches the low-k dielectric layer 108 will not substantially etch the cut region 130. In general, the dielectric constant k is a parameter defining the ability of a material to store energy and/or a charge. The dielectric constant of air is assigned at k=1 and is used as a reference point. $SiO_2$ has a k of about 3.9. Dielectrics having a k>3.9 are referred to as high-k dielectrics. Details of how the cut region 130 and the adjacent lines 120, 122 can be fabricated in accordance with aspects of the invention are depicted in FIGS. 3-9 and described in greater detail subsequently herein.

Referring still to FIG. 2, in accordance with embodiments of the invention, the line 120 is configured and arranged to include a line top surface 120A, a line bottom surface 120B, an outwardly tapered line sidewall 120C, and a substantially non-tapered line sidewall 120D. In accordance with embodiments of the invention, a width dimension of the line top surface 120A is greater than a width dimension of the line bottom surface 120B. In accordance with embodiments of the invention, the line 122 is configured and arranged to include a line top surface 122A, a line bottom surface 122B, and an outwardly tapered line sidewall 122C. In accordance with embodiments of the invention, a width dimension of the line top surface 122A is greater than a width dimension of the line bottom surface 122B. In accordance with embodiments of the invention, the cut region 130 is formed prior to the lines 120, 122, so the cut region sidewalls 130C are templates for the line sidewall 120C and the line sidewall 122C. Accordingly, the line sidewall 120C tapers outwardly from line 120 as one moves along the line sidewall 120C from the line top surface 120A to the line bottom surface 120B. Similarly, the line sidewall 122C tapers outwardly from line 122 as one moves along the line sidewall 122C from the line top surface 122A to the line bottom surface 122B.

Referring still to FIG. 2, the width dimension of the cut region top surface 130A represents a "designed" edge-to-edge spacing between the adjacent lines 120, 122 that is set by the interconnect routing plan of the IC wafer 100, and the width dimension of the cut region bottom surface 130B represents a "post-etch" edge-to-edge spacing between the adjacent lines 120, 122 that is determined by properties of the etchant used to form a cut region trench (e.g., cut region trench 402 shown in FIG. 4) in which the cut region 130 has been formed. In some embodiments of the invention, the cut region trench is formed in the dielectric 108, and the etchant used to form the cut region trench has etch characteristics that etch the dielectric 108 more rapidly in the vertical direction than the horizontal direction, thereby creating a cut region trench with sidewalls that taper inward (moving from top to bottom of the cut region trench) to form the general shape of an upside down pyramid (e.g., cut region trench 402 shown in the line B-B view of FIG. 4). Accordingly, although the routing plan of the IC wafer 100 sets the designed edge-to-edge spacing between the adjacent lines 120, 122, using aspects of the invention, portions of the adjacent lines 120, 122 that are below the top line surfaces 120A, 122A are in fact closer together than the designed edge-to-edge spacing, which has the beneficial result of increasing line density of the IC wafer 100 over interconnect routing plans that are not implemented using aspects of the invention.

FIGS. 3-9 depict the results of fabrication operations for forming well-controlled edge-to-edge spacing between adjacent interconnect structures (e.g., lines 902, 904, 906 shown in FIG. 9) of a portion of an IC wafer structure 100A in accordance with embodiments of the invention. The IC wafer structure 100A is substantially the same as the IC wafer 100 shown in FIGS. 1 and 2. However, the IC wafer structure 100A is organized to illustrate details of a complete line (e.g., line 904 shown in FIG. 9) having adjacent complete cut regions (e.g., cut regions 130 shown in FIG. 9), while the IC wafer 100 is organized to illustrate details of the interfaces between a cut region (e.g., cut region 130 shown in FIG. 2) and adjacent lines (e.g., adjacent lines 120, 122 shown in FIG. 2). Where appropriate, some elements that are substantially identical in the IC wafer structure 100A and the IC wafer 100 are provided with the same reference numbers (e.g., cut region 130 and low-k dielectric 108) in the illustrations of the IC wafer structure 100A and the illustrations of the IC wafer 100. Although not specifically depicted in FIGS. 3-9, in embodiments of the invention, the IC wafer structure 100A includes the substrate 102 (shown in FIG. 1) and the dielectric layers 104, 106 (shown in FIG. 1) positioned under the low-k dielectric 108.

FIG. 3 depicts a top-down view and a line B-B cross-sectional view of the IC wafer structure 100A after fabrication operations according to embodiments of the invention. In accordance with aspects of the invention, known fabrication operations have been used to deposit and planarize a low-k dielectric 108 over other dielectric layers (e.g., layers 104, 106 shown in FIG. 1) of a BEOL region (e.g., BEOL region 110 shown in FIG. 1) of the IC wafer structure 100A. In order to provide a parasitic RC level that is sufficiently low to support high signal speed applications, the low-k dielectric layer 108 can be formed from low-k and/or ULK dielectric materials having a dielectric constant of less than silicon dioxide. In embodiments of the invention, a low-k dielectric generally has a k value that is less than about 4, and a ULK dielectric generally has a k value that is less than about 2.5. Suitable dielectric low-k/ULK materials for reducing interconnect capacitance include, for example, fluorine-doped silicon dioxide; porous organosilicate glass material (e.g., SiCOH); porous silicon dioxide; organic polymeric materials such as polyimide, polynorbornenes, benzocyclobutene, and hydrogen silsesquioxane; and the like.

FIG. 4 depicts a top-down view and a line B-B cross-sectional view of the IC wafer structure 100A after fabrication operations according to embodiments of the invention. In accordance with aspects of the invention, known fabrication operations have been used to pattern and etch a top surface of the low-k dielectric 108 to form cut region trenches 402. In accordance with aspects of the invention, the width dimension W1 of the cut region trenches 402 defines a width dimension of a cut region top surface 130A (shown in FIG. 6) of the cut region 130 (shown in FIG. 6) that will be formed in each of the cut region trenches 402. As previously described in connection with the illustrations shown in FIG. 2, the width dimension W1 of the cut region trenches 402 represents a "designed" edge-to-edge spacing between the to-be-formed adjacent lines (e.g., line pairs 902, 904 or line pairs 904, 906 shown in FIG. 9) that is set by the interconnect routing plan of the IC wafer structure 100A, and the width dimension W2 of the cut region bottom surface 130B represents a "post-etch" edge-to-edge spacing between the to-be-formed adjacent lines (e.g., line pairs 902, 904 or line pairs 904, 906 shown in FIG. 9) that is determined by properties of the etchant used to form the cut region trenches 402. In some embodiments of the invention, the etchant used to form the cut region trenches 402 in the dielectric 108 has etch characteristics that etch the dielectric 108 more rapidly in the vertical direction than the horizontal direction, thereby creating a cut region trench 402 with sidewalls that taper inward (moving from the top to the bottom of the cut region trench 402) to form the general shape of an upside down pyramid. Accordingly, although the routing plan of the IC wafer 100 sets the designed edge-to-edge spacing between the to-be-formed adjacent lines (e.g., line pairs 902, 904 or line pairs 904, 906 shown in FIG. 9), using aspects of the invention, portions of the to-be-formed adjacent lines (e.g., line pairs 902, 904 or line pairs 904, 906 shown in FIG. 9) are in fact closer together than the designed edge-to-edge spacing, which has the beneficial result of increasing line density of the IC wafer structure 100A over interconnect routing plans that are not implemented using aspects of the invention.

Figure 5:
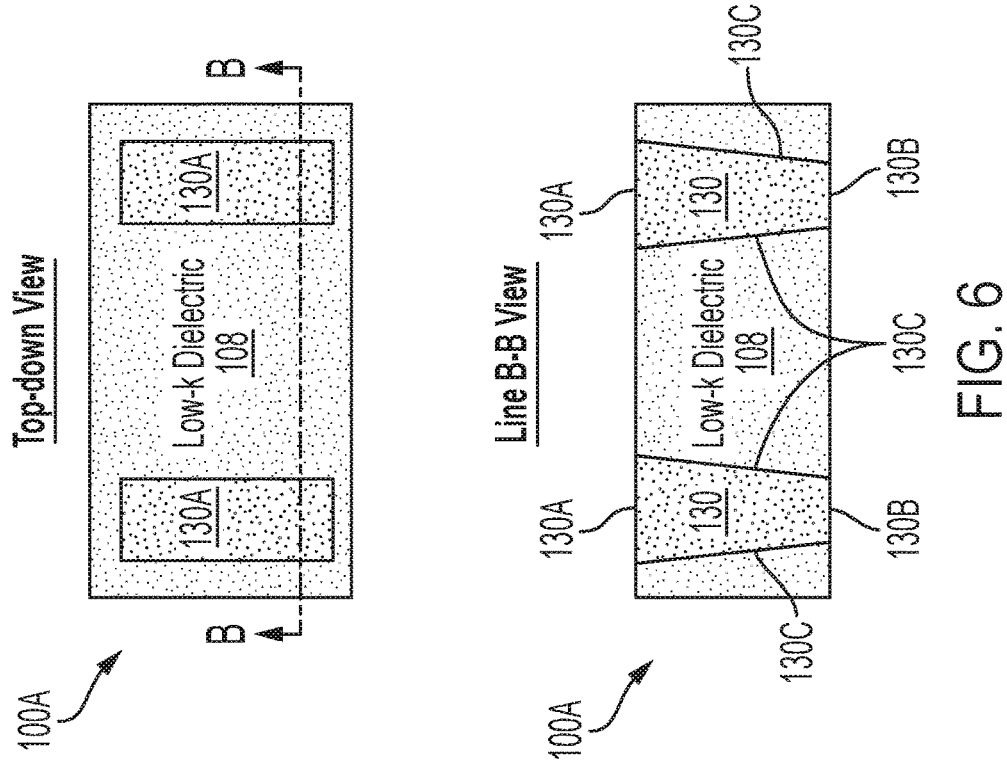

FIG. 5 depicts a top-down view and a line B-B cross-sectional view of the IC wafer structure 100A after fabrication operations according to embodiments of the invention. In accordance with aspects of the invention, known fabrication operations have been used to form a dielectric material 502 over the low-k-dielectric layer 108, thereby filling the cut region trenches 402 (shown in FIG. 4) with the dielectric material 502 and forming an overburden of the dielectric material 502 that covers the top of the low-k dielectric 108. In embodiments of the invention, the dielectric material 502 has an etch selectivity with respect to the low-k dielectric layer 108 such that an etchant that etches the low-k dielectric layer 108 will not substantially etch the dielectric material 502. In accordance with aspects of the invention, the dielectric material 502 can be formed from a nitride dielectric material having etch selectivity with respect to the low-k dielectric layer 108 such that an etchant that etches the low-k dielectric layer 108 will not substantially etch the dielectric material 502. In accordance with aspects of the invention, the dielectric material 502 is formed from a high-k dielectric material having etch selectivity with respect to the low-k dielectric layer 108 such that an etchant that etches the low-k dielectric layer 108 will not substantially etch the dielectric material 502.

Figure 6:
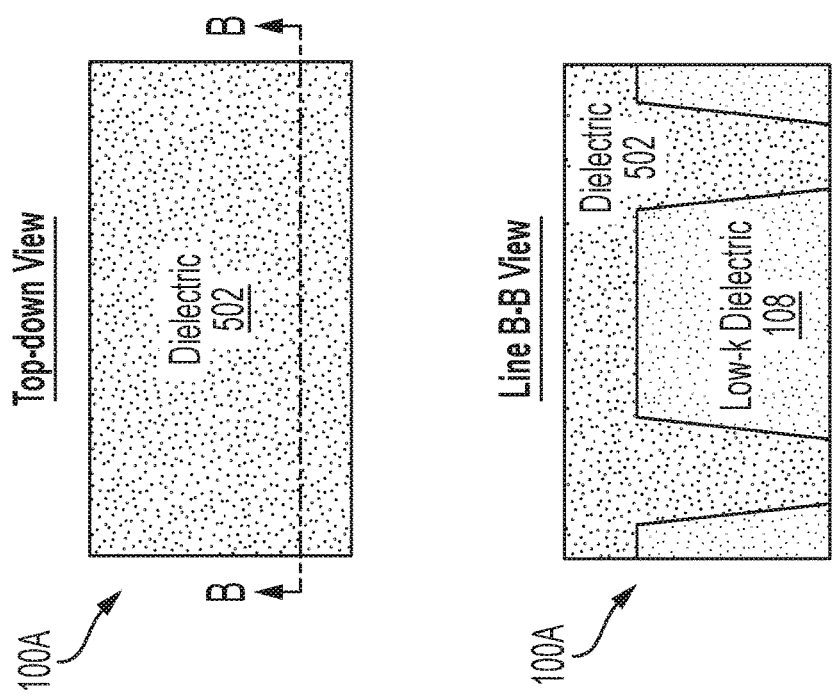

FIG. 6 depicts a top-down view and a line B-B cross-sectional view of the IC wafer structure 100A after fabrication operations according to embodiments of the invention. In accordance with aspects of the invention, known fabrication operations have been used to planarize the IC wafer structure 100A to the level shown, thereby removing the overburden of the dielectric material 502 (shown in FIG. 5) and forming the cut regions 130. In accordance with embodiments of the invention, each cut region 130 includes a cut region top surface 130A, a cut region bottom surface 130B, and cut region sidewalls 130C. In accordance with embodiments of the invention, a width dimension of the cut region top surface 130A (e.g., W1 shown in FIG. 4, line B-B view) is greater than a width dimension of the cut region bottom surface 130B (e.g., W2 shown in FIG. 4, line B-B), and the cut region sidewalls 130C are substantially non-parallel with respect one another, thereby creating cut region sidewalls 130C that taper inward toward one another as one moves along each cut region sidewall 130C from the cut region top surface 130A to the cut region bottom surface 130B.

Figure 7:
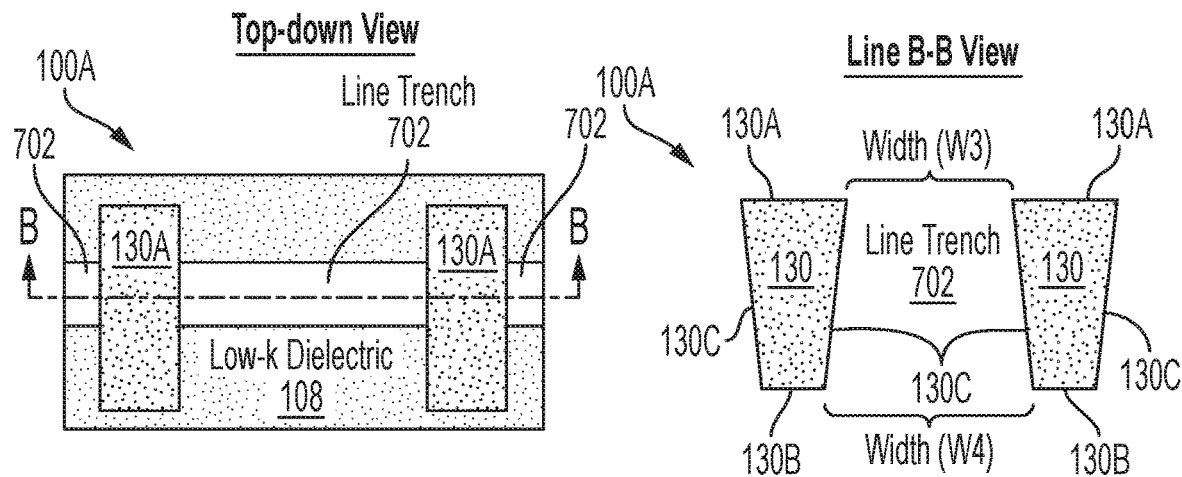

FIG. 7 depicts a top-down view and a line B-B cross-sectional view of the IC wafer structure 100A after fabrication operations according to embodiments of the invention. In accordance with aspects of the invention, known fabrication operations have been used to pattern and etch (e.g., using a reactive ion etch (RIE)) the low-k dielectric 502 to form therein line trenches 702 according to the interconnect routing plan of the IC wafer structure 100A. In accordance with aspects of the invention, the etchant used to form the line trenches 702 has etch selectivity that preferentially etches the low-k dielectric 108 over the cut region 130. In some embodiments of the invention, the etchant used to form the line trenches 702 can be provided with an etch selectivity for the cut regions 130 that is less than the etchant's etch selectivity for the low-k dielectric 108. In some embodiments of the invention, although the etchant used to form the line trenches 702 has a relatively low etch selectivity to the cut regions 130, the etchant used to form the line trenches 702 can still be provided with sufficient etch selectivity to the cut regions 130 to increase the inward taper of the cut region sidewalls 130C.

As best shown in the line B-B view of FIG. 7, in accordance with aspects of the invention, a width dimension W3 of the line trenches 702 defines a width dimension of a line top surface 904A (shown in FIG. 9) of the line 904 (shown in FIG. 9) that will be formed in each of the line trenches 702. As also shown in the line B-B view of FIG. 7, in accordance with aspects of the invention, a width dimension W4 of the line trenches 702 defines a width dimension of a line bottom surface 904B (shown in FIG. 9) of the line 904 that will be formed in each of the line trenches 702. In embodiments of the invention, because the cut regions 130 are formed prior to forming the lines 902, 904, 906 (shown in FIG. 9), the cut region sidewalls 130C form sidewalls of the line trenches 702 and will act as templates for the to-be-formed line sidewalls 904C (shown in FIG. 9). Accordingly, the cut region sidewalls 130C ensure that the width dimension W3 of the line top surface 904A is less than the width dimension W4 of the line bottom surface 904B. Accordingly, the cut region sidewalls 130C ensure that the line sidewalls 904C taper outwardly from the line 904 as one moves along the line sidewalls 904C from the line top surface 904A to the line bottom surface 904B.

Figure 8:
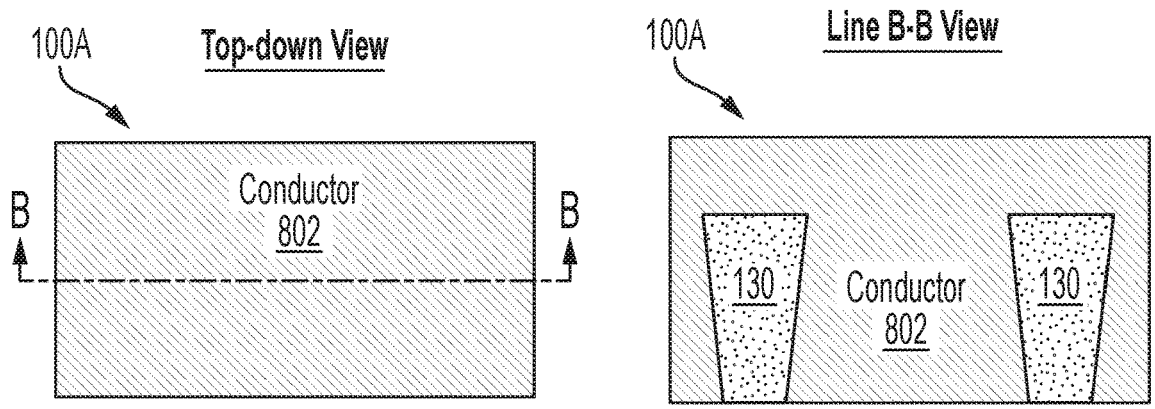

FIG. 8 depicts a top-down view and a line B-B cross-sectional view of the IC wafer structure 100A after fabrication operations have been used to deposit a conductor 802 within the line trenches 702 (shown in FIG. 7). In accordance with aspects of the invention, the line trenches 702 are coated by a refractory metal barrier (not shown) such as Ta and $TaN_x$ followed by a thin sputtered metal (e.g., copper) seed layer (not shown separately from the conductor 802). The seed layer allows for the electrochemical deposition (ECD) of a thick layer of the conductor 802 that fills up the line trenches 702 and covers the IC wafer structure 100A. In embodiments of the invention, the conductor 802 can include a layer of the refractory metal barrier and a conductive material such as Cu, Co, Ru, as well as combinations and/or alloys thereof.

Figure 9:
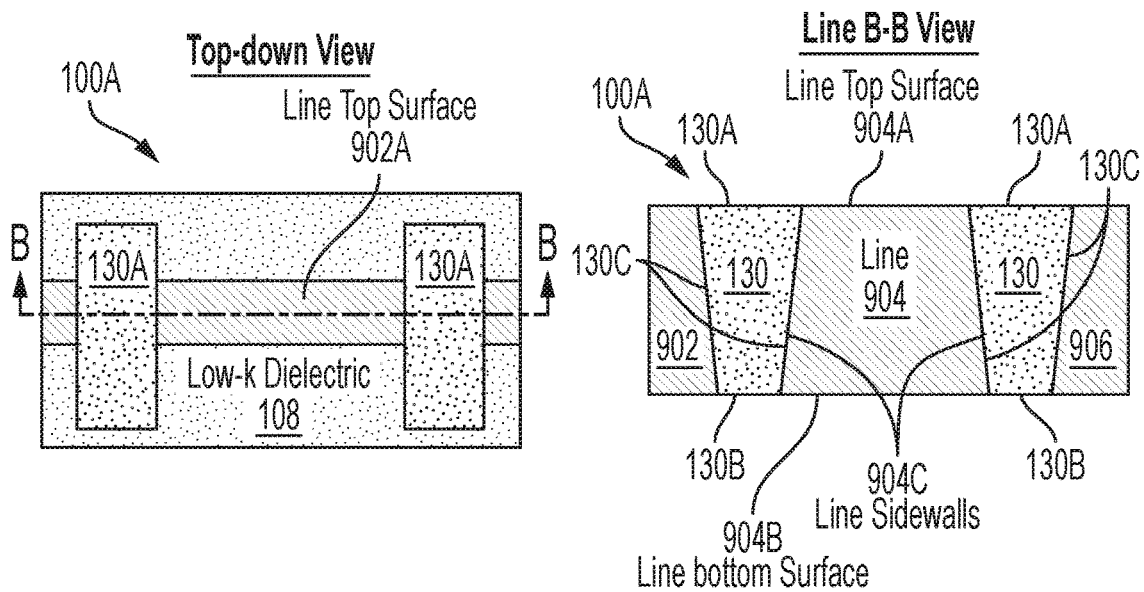

FIG. 9 depicts a top-down view and a line B-B cross-sectional view of the IC wafer structure 100A after fabrication operations according to embodiments of the invention. In accordance with aspects of the invention, planarization operations (e.g., chemical mechanical planarization (CMP)) have been used to remove excess amounts of the conductor 802 (shown in FIG. 8), thereby forming adjacent pairs of lines 902, 904 and adjacent pairs of lines 904, 906. In accordance with embodiments of the invention, the line 904 has a line top surface 904A, a line bottom surface 904B, and line sidewalls 904C that taper outward from the line 904 moving from the line top surface 904A to the line bottom surface 904B. In accordance with embodiments of the invention, a width dimension of the line top surface 904A is defined by the width dimension W3 of the line trench 702 (shown in FIG. 8), and a width dimension of the line bottom surface 904B is defined by the width dimension W4 of the line trench 702. Accordingly, the width dimension of the line top surface 904A is greater than the width dimension of the line bottom surface 904B. In accordance with embodiments of the invention, because the cut regions 130 were formed prior to the lines 902, 904, 906, the cut region sidewalls 130C are templates for the line sidewalls 904C. Accordingly, the line sidewalls 904C taper outwardly from line 904 as one moves along the line sidewalls 904C from the line top surface 904A to the line bottom surface 904B.

Referring still to FIG. 9, the width dimension of each of the cut region top surfaces 130A represents a "designed" edge-to-edge spacing between the adjacent lines 902/904 and/or 904/906 that is set by the interconnect routing plan of the IC wafer structure 100A, and the width dimension of each of the cut region bottom surfaces 130B represents a "post-etch" edge-to-edge spacing between the adjacent lines 902/904 and/or 904/906 that is determined by properties of the etchant used to form the cut region trenches 402 (shown in FIG. 4) in which the cut regions 130 have been formed. In some embodiments of the invention, the etchant used to form the cut region trenches 402 in the dielectric 108 (shown in FIG. 4) has etch characteristics that etch the dielectric 108 more rapidly in the vertical direction than the horizontal direction, thereby creating cut region trenches 402 with sidewalls that taper inward (moving from the top to the bottom of each of the cut region trenches 402) to form the general shape of an upside down pyramid. Accordingly, although the routing plan of the IC wafer structure 100A sets the designed edge-to-edge spacing between the adjacent lines 902/904 and/or 904/906, using aspects of the invention, portions of the adjacent lines 902/904 and/or 904/906 that are below the top line surface 904A are in fact closer together than the designed edge-to-edge spacing, which has the beneficial result of increasing line density of the IC wafer structure 100A over interconnect routing plans that are implemented without benefit of aspects of the invention.

After the planarization operations shown in FIG. 9, a thin dielectric film also known as a "cap layer" (not shown) can be deposited over the low-k/ULK dielectric layer 108. The cap layer acts as a diffusion barrier to prevent diffusion of conductive material (e.g., copper) from the lines 902, 904, 906 into the surrounding dielectric material during subsequent BEOL processing steps. Electrical contact can be made to the lines 902, 904, 906 by forming contacts (or other interconnect structures) configured and arranged to extend through the cap layer to make electrical contact with the lines 902, 904, 906. In embodiments of the invention, the cap layer can be SiN.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

"Planarization" and "planarize" as used herein refer to a material removal process that employs at least mechanical forces, such as frictional media, to produce a substantially two-dimensional surface. A planarization process can include chemical mechanical polishing (CMP) or grinding. CMP is a material removal process that uses both chemical reactions and mechanical forces to remove material and planarize a surface.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a multi-layer integrated circuit (IC) structure, the method comprising:

forming a substrate having a major surface;

forming a dielectric layer comprising a dielectric material, the dielectric layer positioned above the major surface of the substrate;

forming in the dielectric layer a first interconnect element having a first interconnect element top surface, a first interconnect element bottom surface, and a first interconnect element sidewall extending from an edge of the first interconnect element top surface to an edge of the first interconnect element bottom surface;

wherein a width dimension of the first interconnect element top surface is less than a width dimension of the first interconnect element bottom surface; and forming in the dielectric layer a second interconnect element having a second interconnect element top surface, a second interconnect element bottom surface, and a second interconnect element sidewall extending from an edge of the second interconnect element top surface to an edge of the second interconnect element bottom surface;

wherein a width dimension of the second interconnect element top surface is less than a width dimension of the second interconnect element bottom surface;

wherein a spacing from the edge of the first interconnect element top surface to the edge of the second interconnect element top surface is greater than a spacing from the edge of the first interconnect element bottom surface to the edge of the second interconnect element bottom surface; and wherein the spacing from the edge of the first interconnect element bottom surface to the edge of the second interconnect element bottom surface is determined based on etch characteristics of an etchant used to remove portions of the dielectric material from a space between the first interconnect element sidewall and the second interconnect element sidewall.

2. The method of claim 1, wherein:

the dielectric material comprises a low-k dielectric; and the first interconnect element comprises a first conductive line configured to conduct current in a horizontal direction through a first portion of the dielectric layer.

3. The method of claim 2, wherein the second interconnect element comprises a second conductive line configured to conduct current in a horizontal direction through a second portion of the second dielectric layer.

4. The method of claim 1, wherein the spacing from the edge of the first interconnect element top surface to the edge of the second interconnect element top surface is determined based on a routing plan of the multi-layer IC.

5. The method of claim 1, wherein the etch characteristics comprise a horizontal etch characteristic of the etchant used to remove portions of the dielectric material from the space between the first interconnect element sidewall and the second interconnect element sidewall.

6. The method of claim 5, wherein the etch characteristics further comprise a vertical etch characteristic of the etchant used to remove portions of the dielectric material from the space between the first interconnect element sidewall and the second interconnect element sidewall.

7. The method of claim 6, wherein the horizontal etch characteristics comprise a horizontal etch speed comprising an etch speed at which the etchant removes portions of the dielectric material in a horizontal direction.

8. The method of claim 7, wherein the vertical etch characteristics comprise a vertical etch speed comprising a speed at which the etchant removes portions of the dielectric material in a vertical direction.

9. The method of claim 8, wherein the vertical etch speed is greater than the horizontal etch speed.

10. A method of forming a multi-layer integrated circuit (IC) structure, the method comprising:
forming a substrate having a major surface;
forming a first dielectric layer comprising a first dielectric material, the first dielectric layer positioned above the major surface of the substrate; and
forming in the first dielectric layer a cut region having:
a cut region top surface;
a cut region bottom surface;
a cut region first sidewall extending from a first edge of the cut region top surface to a first edge of the cut region bottom surface; and
a cut region second sidewall extending from a second edge of the cut region top surface to a second edge of the cut region bottom surface;
wherein the cut region comprises a cut region material;
wherein a width dimension of the cut region top surface is greater than a width dimension of the cut region bottom surface; and
wherein an etch rate characteristic of the first dielectric material in response to an etchant is greater than an etch rate characteristic of the cut region material in response to the etchant.

11. The method of claim 10 further comprising:
forming in the first dielectric layer a first interconnect element having a first interconnect element top surface, a first interconnect element bottom surface, and a first interconnect element sidewall extending from an edge of the first interconnect element top surface to an edge of the first interconnect element bottom surface;
wherein a width dimension of the first interconnect element top surface is less than a width dimension of the first interconnect element bottom surface; and
forming in the first dielectric layer a second interconnect element having a second interconnect element top surface, a second interconnect element bottom surface, and a second interconnect element sidewall extending from an edge of the second interconnect element top surface to an edge of the second interconnect element bottom surface;
wherein a width dimension of the second interconnect element top surface is less than a width dimension of the second interconnect element bottom surface;
wherein a spacing from the edge of the first interconnect element top surface to the edge of the second interconnect element top surface is greater than a spacing from the edge of the first interconnect element bottom surface to the edge of the second interconnect element bottom surface; and
wherein the cut region is in a space between the first interconnect element and the second interconnect element.

12. The method of claim 11, wherein:
the first dielectric material comprises an oxide;
the cut region material comprises a nitride;
the first interconnect element comprises a first conductive line configured to conduct current in a horizontal direction through a first portion of the first dielectric layer; and
the second interconnect element comprises a second conductive line configured to conduct current in a horizontal direction through a second portion of the second dielectric layer.

13. The method of claim 12, wherein:
the spacing from the edge of the first interconnect element top surface to the edge of the second interconnect element top surface is determined based on a routing plan of the multi-layer IC;
the spacing from the edge of the first interconnect element bottom surface to the edge of the second interconnect element bottom surface is determined based on etch characteristics of the etchant, wherein the etchant has been used to remove portions of the first dielectric material from the space between the first interconnect element sidewall and the second interconnect element sidewall;
the etch characteristics comprise a horizontal etch characteristic of the etchant that has been used to remove portions of the first dielectric material from the space between the first interconnect element sidewall and the second interconnect element sidewall;
the etch characteristics further comprise a vertical etch characteristic of the etchant that has been used to remove portions of the first dielectric material from the space between the first interconnect element sidewall and the second interconnect element sidewall;
the horizontal etch characteristics comprise a horizontal etch speed comprising an etch speed at which the etchant removes portions of the first dielectric material in a horizontal direction;
the vertical etch characteristics comprise a vertical etch speed comprising a speed at which the etchant removes portions of the first dielectric material in a vertical direction; and
the vertical etch speed is greater than the horizontal etch speed.

14. A multi-layer integrated circuit (IC) structure comprising:
a substrate having a major surface;
a first dielectric layer comprising a first dielectric material, the first dielectric layer positioned above the major surface of the substrate; and
a cut region formed in the first dielectric layer, the cut region having:
a cut region top surface;
a cut region bottom surface;
a cut region first sidewall extending from a first edge of the cut region top surface to a first edge of the cut region bottom surface; and
a cut region second sidewall extending from a second edge of the cut region top surface to a second edge of the cut region bottom surface;
wherein a width dimension of the cut region top surface is greater than a width dimension of the cut region bottom surface;
wherein the cut region comprises a cut region material; and wherein an etch rate characteristic of the first dielectric material in response to an etchant is greater than an etch rate characteristic of the cut region material in response to the etchant.

15. The IC structure of claim 14 further comprising:

a first interconnect element formed in the first dielectric layer, the first interconnect element having a first interconnect element top surface, a first interconnect element bottom surface, and a first interconnect element sidewall extending from an edge of the first interconnect element top surface to an edge of the first interconnect element bottom surface;

wherein a width dimension of the first interconnect element top surface is less than a width dimension of the first interconnect element bottom surface; and a second interconnect element formed in the first dielectric layer, the second interconnect element having a second interconnect element top surface, a second interconnect element bottom surface, and a second interconnect element sidewall extending from an edge of the second interconnect element top surface to an edge of the second interconnect element bottom surface;

wherein a width dimension of the second interconnect element top surface is less than a width dimension of the second interconnect element bottom surface;

wherein a spacing from the edge of the first interconnect element top surface to the edge of the second interconnect element top surface is greater than a spacing from the edge of the first interconnect element bottom surface to the edge of the second interconnect element bottom surface; and wherein the cut region is in a space between the first interconnect element and the second interconnect element.

16. The IC structure of claim 15, wherein:

the first dielectric material comprises an oxide;

the cut region material comprises a nitride;

the first interconnect element comprises a first conductive line configured to conduct current in a horizontal direction through a first portion of the first dielectric layer; and the second interconnect element comprises a second conductive line configured to conduct current in a horizontal direction through a second portion of the second dielectric layer.

17. The IC structure of claim 16, wherein:

the spacing from the edge of the first interconnect element top surface to the edge of the second interconnect element top surface is determined based on a routing plan of the multi-layer IC;

the spacing from the edge of the first interconnect element bottom surface to the edge of the second interconnect element bottom surface is determined based on etch characteristics of the etchant, wherein the etchant has been used to remove portions of the first dielectric material from the space between the first interconnect element sidewall and the second interconnect element sidewall;

the etch characteristics comprise a horizontal etch characteristic of the etchant that has been used to remove portions of the first dielectric material from the space between the first interconnect element sidewall and the second interconnect element sidewall; and the etch characteristics further comprise a vertical etch characteristic of the etchant that has been used to remove portions of the first dielectric material from the space between the first interconnect element sidewall and the second interconnect element sidewall.

18. The IC structure of claim 17, wherein the horizontal etch characteristics comprise a horizontal etch speed comprising an etch speed at which the etchant removes portions of the first dielectric material in a horizontal direction.

19. The IC structure of claim 18, wherein the vertical etch characteristics comprise a vertical etch speed comprising a speed at which the etchant removes portions of the first dielectric material in a vertical direction.

20. The IC structure of claim 19, wherein the vertical etch speed is greater than the horizontal etch speed.

* * * * *